(12) United States Patent
Izutani et al.

(10) Patent No.: US 8,547,465 B2
(45) Date of Patent: Oct. 1, 2013

(54) IMAGING DEVICE MODULE

(75) Inventors: Seiji Izutani, Ibaraki (JP); Hisae Uchiyama, Ibaraki (JP); Takahiro Fukuoka, Ibaraki (JP); Kazutaka Hara, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/016,616

(22) Filed: Jan. 28, 2011

(65) Prior Publication Data
US 2011/0261242 A1 Oct. 27, 2011

(30) Foreign Application Priority Data

| Jan. 29, 2010 | (JP) | ................................. 2010-018256 |
| Apr. 9, 2010 | (JP) | ................................. 2010-090908 |
| Jul. 30, 2010 | (JP) | ................................. 2010-172328 |

(51) Int. Cl.
*H04N 5/335* (2011.01)

(52) U.S. Cl.
USPC ........... 348/308; 348/294; 257/290; 257/292; 257/625; 358/482; 358/513; 358/514

(58) Field of Classification Search
USPC ....................................................... 348/308
See application file for complete search history.

(56) References Cited

U.S. PATENT DOCUMENTS

| 4,568,592 | A | 2/1986 | Kawaguchi et al. |
| 4,960,734 | A | 10/1990 | Kanai et al. |
| 6,162,849 | A | 12/2000 | Zhuo et al. |
| 6,252,726 | B1 | 6/2001 | Verdiell |
| 6,831,031 | B2 | 12/2004 | Ishihara |
| 7,170,151 | B2 | 1/2007 | Elpedes et al. |
| 7,264,869 | B2 | 9/2007 | Tobita et al. |
| 7,602,051 | B2 | 10/2009 | Ito et al. |
| 7,718,456 | B2 | 5/2010 | Maeda et al. |
| 7,772,692 | B2 | 8/2010 | Takamatsu et al. |
| 7,825,422 | B2 | 11/2010 | Maeda et al. |
| 7,973,243 | B2 | 7/2011 | Hatano et al. |
| 8,007,897 | B2 | 8/2011 | Ito et al. |
| 2002/0058743 | A1 | 5/2002 | Tobita et al. |
| 2002/0197923 | A1 | 12/2002 | Tobita et al. |
| 2004/0041257 | A1 | 3/2004 | Tobita et al. |

(Continued)

FOREIGN PATENT DOCUMENTS

| JP | 02-192467 A | 7/1990 |
| JP | 2002-057442 A | 2/2002 |

(Continued)

OTHER PUBLICATIONS

United States Office Action dated Nov. 6, 2012 for related U.S. Appl. No. 13/016,521.

(Continued)

*Primary Examiner* — Roberto Velez
*Assistant Examiner* — Quan Pham
(74) *Attorney, Agent, or Firm* — Sughrue Mion, PLLC

(57) ABSTRACT

An imaging device module includes an imaging device including a light incident plane on which light is incident, and a reverse face disposed on an opposite side of the light incident plane; and a thermal conductive sheet provided on the reverse face for dissipating heat generated from the imaging device.

The thermal conductive sheet contains a plate-like boron nitride particle, and the thermal conductive sheet has a thermal conductivity in a direction perpendicular to the thickness direction of 4 W/m·K or more.

3 Claims, 4 Drawing Sheets

(56) References Cited

U.S. PATENT DOCUMENTS

| | | | |
|---|---|---|---|
| 2006/0165978 | A1 | 7/2006 | Ito et al. |
| 2007/0013067 | A1 | 1/2007 | Nishida et al. |
| 2007/0205706 | A1 | 9/2007 | Yamada et al. |
| 2007/0259211 | A1 | 11/2007 | Wang |
| 2008/0128067 | A1 | 6/2008 | Sayir et al. |
| 2008/0224303 | A1 | 9/2008 | Funakoshi et al. |
| 2008/0271832 | A1 | 11/2008 | Pieslak et al. |
| 2009/0091045 | A1 | 4/2009 | Tanikawa et al. |
| 2010/0013086 | A1 | 1/2010 | Obiraki et al. |
| 2010/0063192 | A1 | 3/2010 | Okubo et al. |
| 2010/0110271 | A1* | 5/2010 | Yanagita et al. ............ 348/340 |
| 2010/0200801 | A1* | 8/2010 | Ramasamy et al. ............ 252/74 |
| 2010/0283001 | A1 | 11/2010 | Pot et al. |
| 2010/0301258 | A1 | 12/2010 | Chen et al. |
| 2011/0192588 | A1 | 8/2011 | Suzuki et al. |
| 2012/0285674 | A1 | 11/2012 | Hirano |
| 2012/0286194 | A1 | 11/2012 | Hirano |

FOREIGN PATENT DOCUMENTS

| | | | |
|---|---|---|---|
| JP | 2002114575 A | * | 4/2002 |
| JP | 2004-302067 A | | 10/2004 |
| JP | 2008-177917 A | | 7/2008 |
| JP | 2008189818 A | * | 8/2008 |
| JP | 2008-280496 A | | 11/2008 |
| JP | 2008280436 A | * | 11/2008 |
| JP | 2010-010469 A | | 1/2010 |
| WO | 2008/139968 A1 | | 11/2008 |

OTHER PUBLICATIONS

"Lead other companies with a LED bulb", http://it.nikkei.co.jp/business/news/index.aspx?n=MMIT2J000024112009, Nikkei Digital Media, Inc, 2010.

United States Office Action dated Dec. 31, 2012 for related U.S. Appl. No. 13/016,685.

"Polar Therm Boron Nitride Filler: PT110 Condensed Product Bulletin". Momentive Performance Materials Inc., (2012).

"Polar Therm Boron Nitride Filler: PT120 Condensed Product Bulletin". Momentive Performance Materials Inc., (2012).

HM-02, URL:http://www.ainex.jp/products/hm-02.htm, dated Jan. 14, 2011.

U.S. Non-Final Office Action issued in U.S. Appl. No. 13/016,822 dated Jan. 31, 2013.

U.S. Non-Final Office Action issued in U.S. Appl. No. 13/016,507 dated Jan. 30, 2013.

U.S. Non-Final Office Action issued in U.S. Appl. No. 13/016,424 dated Jan. 30, 2013.

U.S. Non-Final Office Action issued in U.S. Appl. No. 13/016,467 dated Feb. 4, 2013.

U.S. Non-Final Office Action issued in U.S. Appl. No. 13/016,726 dated Feb. 4, 2013.

U.S. Non-Final Office Action issued in U.S. Appl. No. 13/016,549 dated Feb. 4, 2013.

Nihon Data Material., Ltd Web Site (http://www.demac.co.jp/products/denshi.html), dated Jan. 14, 2011.

U.S. Notice of Allowance issued in U.S. Appl. No. 13/016,594 dated Dec. 26, 2012.

H.W. Hill, Jr. D.G. Brady, "Poly(arylene sulfide)s," May 15, 2008, Encyclopedia of Polymer Science and Technology, http://onlinelibrary.wiley.com/doi/10.1002/0471440264.pst246/abstract.

U.S. Non-Final Office Action issued in U.S. Appl. No. 13/016,594 dated Apr. 12, 2013.

Office Action dated Jul. 12, 2013 issued in corresponding U.S. Appl. No. 13/016,424.

Office Action dated Jul. 12, 2013 issued in corresponding U.S. Appl. No. 13/016,507.

Office Action dated Jul. 11, 2013 issued in corresponding U.S. Appl. No. 13/016,467.

Office Action dated Jul. 12, 2013 issued in corresponding U.S. Appl. No. 13/016,726.

Office Action dated Jul. 12, 2013 issued in corresponding U.S. Appl. No. 13/016,549.

Office Action dated Jul. 16, 2013 issued in corresponding U.S. Appl. No. 13/016,685.

Office Action dated Jul. 15, 2013 issued in corresponding U.S. Appl. No. 13/016,822.

Office Action dated Jul. 17, 2013 issued in corresponding U.S. Appl. No. 13/016,521.

* cited by examiner

FIG. 2
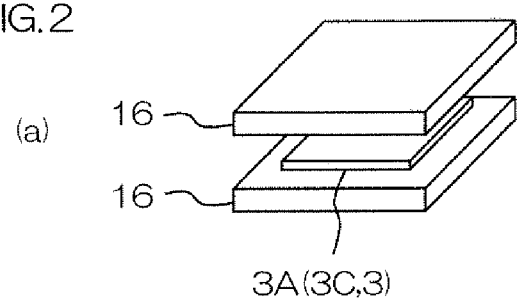
(a)
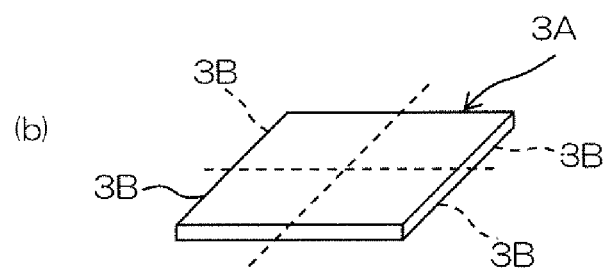
(b)
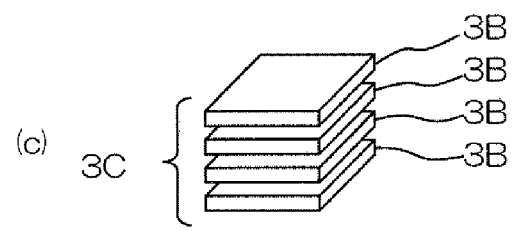
(c)

IMAGING DEVICE MODULE

CROSS-REFERENCE TO RELATED APPLICATION

The present application claims priority from Japanese Patent Application No. 2010-018256 filed on Jan. 29, 2010; Japanese Patent Application No. 2010-090908 filed on Apr. 9, 2010; and Japanese Patent Application No. 2010-172328 filed on Jul. 30, 2010, the contents of which are hereby incorporated by reference into this application.

BACKGROUND OF THE INVENTION

1. Field of the Invention

The present invention relates to an imaging device module. To be specific, the present invention relates to an imaging device module included in an imaging apparatus.

2. Description of the Related Art

In these days, in an imaging apparatus such as a digital camera, an imaging device such as a CCD (Charge Coupled Device) image sensor, or a CMOS (Complementary Metal Oxide Semiconductor) image sensor is used in a plural number in accordance with the number of pixels of the imaging apparatus.

These imaging devices may have problems such as noise generation at high temperature.

Thus, providing a heat dissipation member in an imaging device to suppress an increase in temperature of the imaging device has been examined.

To be more specific, for example, the following is proposed (e.g., see Japanese Unexamined Patent Publication No. 2008-177917): in a solid-state imaging apparatus, a thermal conductive member of a graphite sheet is provided on the reverse face of the image plane of the imaging device; and a thermoelectric cooler such as a Peltier device and a heat dissipation member are provided on the side face (relative to the image plane) of the imaging device so that the thermoelectric cooler and the heat dissipation member are in contact with the graphite sheet.

In the solid-state imaging apparatus of Japanese Unexamined Patent Publication No. 2008-177917, the thermoelectric cooler and the heat dissipation member are disposed at the side face side of the imaging device, and also a graphite sheet having a high thermal conduction efficiency in the thickness direction is disposed as a thermal conductive member so as to be in contact with the thermoelectric cooler and the imaging device, in an attempt to improve heat dissipation and reduce the size of the solid-state imaging apparatus.

SUMMARY OF THE INVENTION

However, the graphite sheet used in Japanese Unexamined Patent Publication No. 2008-177917 is expensive, and therefore it is disadvantageous in terms of costs.

In addition, because the sensitivity of imaging devices changes depending on temperature conditions, it is desired to reduce temperature nonuniformity (to equalize temperature) in order to achieve uniform sensitivity.

Thus, an object of the present invention is to provide an imaging device module that allows cost reduction and equalize temperature, and is excellent in heat dissipation.

An imaging device module of the present invention includes an imaging device including a light incident plane on which light is incident, and a reverse face disposed on an opposite side of the light incident plane; and a thermal conductive sheet provided on the reverse face for dissipating heat generated from the imaging device, wherein the thermal conductive sheet contains a plate-like boron nitride particle, and the thermal conductive sheet has a thermal conductivity in a direction perpendicular to the thickness direction of 4 W/m·K or more.

This imaging device module includes the thermal conductive sheet on the reverse face disposed on the opposite side of the light incident plane of the imaging device. To be specific, the thermal conductive sheet containing plate-like boron nitride particles and having a thermal conductivity in a direction (that is, plane direction) perpendicular to the thickness direction of 4 W/m·K or more is included. Therefore, heat can be dissipated uniformly in the plane direction to reduce temperature nonuniformity (equalize temperature), and excellent heat dissipation can be ensured. As a result, an improvement in sensitivity can be achieved.

In addition, because such a thermal conductive sheet is produced at a cost lower than that of a graphite sheet, cost reduction can be achieved.

It is preferable that the imaging device module of the present invention is a CMOS image sensor.

It is preferable that the imaging device module of the present invention is a back-illuminated CMOS image sensor.

With the imaging device module of the present invention, uniform temperature can be achieved, while excellent heat dissipation can be ensured, and further, cost reduction can be achieved.

BRIEF DESCRIPTION OF THE DRAWINGS

FIG. 2 is a process drawing for describing a method for producing a thermal conductive sheet included in the imaging device module shown in FIG. 1, (a) illustrating a step of hot pressing a mixture or a laminated sheet, (b) illustrating a step of dividing the pressed sheet into a plurality of pieces, and (c) illustrating a step of laminating the divided sheets.

DETAILED DESCRIPTION OF THE INVENTION

Figure 1:
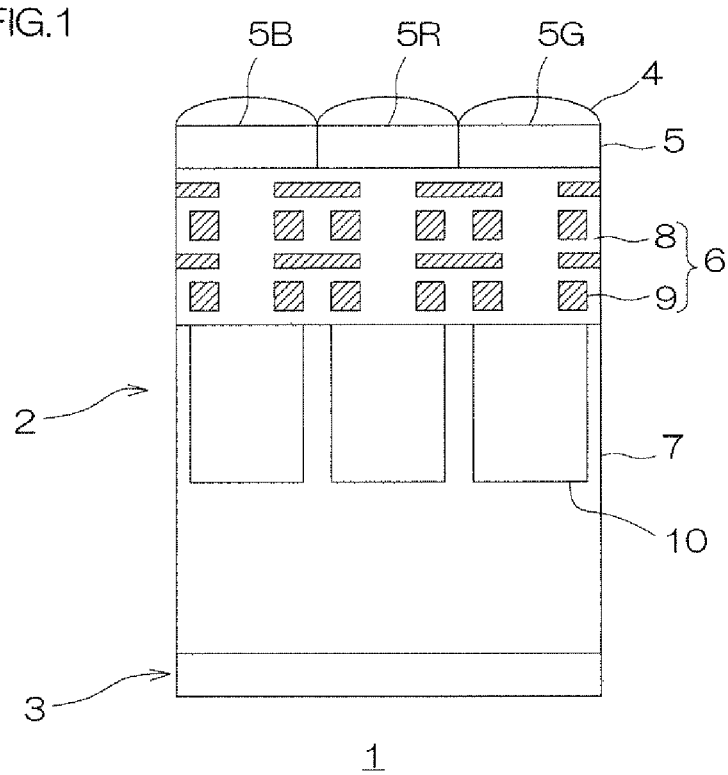
FIG. 1 is a schematic diagram illustrating the configuration of an embodiment of the imaging device module of the present invention.
Figure 3:
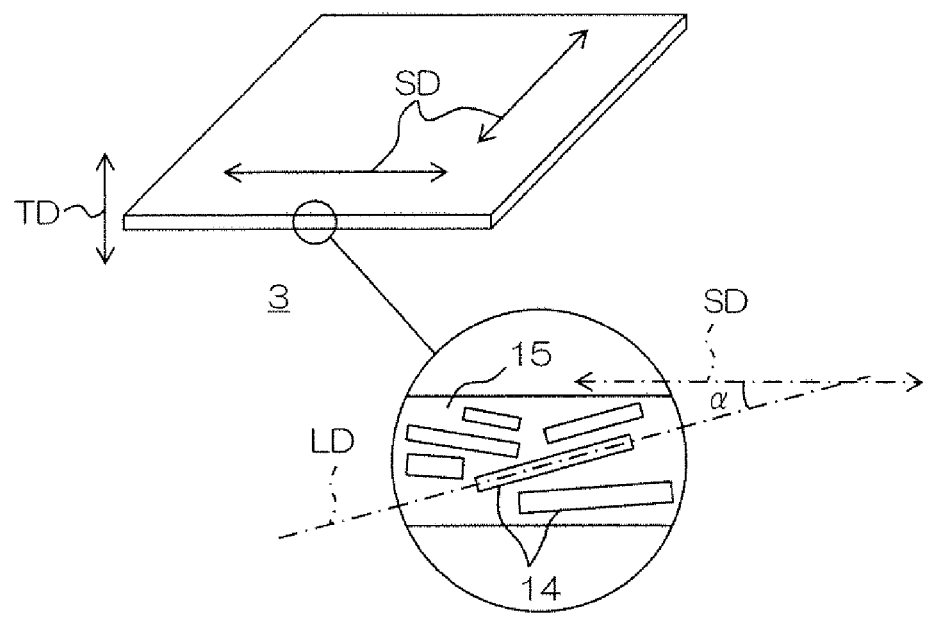
FIG. 3 shows a perspective view of the thermal conductive sheet shown in FIG. 2.

FIG. 1 is a schematic diagram illustrating the configuration of an embodiment of the imaging device module of the present invention, FIG. 2 is a process drawing for describing a method for producing a thermal conductive sheet included in the imaging device module shown in FIG. 1, and FIG. 3 is a perspective view of the thermal conductive sheet shown in FIG. 2.

In FIG. 1, an imaging device module 1 includes an imaging device 2, and a thermal conductive sheet 3 for dissipating heat generated from the imaging device 2.

The imaging device 2 is a device including a photoelectric conversion device (light-receiving device 10 described later) that converts light received to an electrical signal, and is provided in an imaging apparatus (not shown) such as a digital camera or a digital camcorder in a plural number in accordance with the number of pixels.

Although examples of the imaging device 2 include a CCD image sensor, and CMOS image sensors such as a front-illuminated CMOS image sensor and a back-illuminated CMOS image sensor, in this embodiment, a CMOS image sensor, to be specific, a front-illuminated CMOS image sensor is used as the imaging device 2.

This imaging device 2 includes a light-collecting lens 4, a color filter 5, a circuit board 6, and a light-receiving substrate 7.

The light-collecting lens 4 is a lens formed into a generally semielliptic shape when viewed in cross section. The bottom face of the light-collecting lens 4 is in close contact with the color filter 5, and the top face (curved face) of the light-collecting lens 4 is exposed, so as to serve as a light incident plane on which light is incident.

A plurality (three) of the light-collecting lenses 4 are provided in the imaging device 2, so as to correspond to a green filter 5G, a red filter 5R, and a blue filter 5B described later.

The color filter 5 is formed into a thin film, and includes a green filter 5G, a red filter 5R, and a blue filter 5B.

The green filter 5G is a light-transmitting film having a high transmittance in a wavelength range of green light, separates light incident through the light incident plane of the light-collecting lens 4, and allows green light to pass through.

The red filter 5R is a light-transmitting film having a high transmittance in a wavelength range of red light, separates light incident through the light incident plane of the light-collecting lens 4, and allows red light to pass through.

The blue filter 5B is a light-transmitting film having a high transmittance in a wavelength range of blue light, separates light incident through the light incident plane of the light-collecting lens 4, and allows blue light to pass through.

The green filter 5G, the red filter 5R, and the blue filter 5B are produced by a known method, and are arranged adjacently, thereby forming the color filter 5.

The circuit board 6 includes an insulating layer 8, and a conductive pattern 9 embedded in the insulating layer 8.

The insulating layer 8 is formed from a light transmissive material that transmits light, and is interposed between the conductive patterns 9 so as to insulate the conductive patterns 9.

Although there is no particular limitation on the light transmissive material, examples thereof include silicon oxide, and also added silicon oxide which is obtained by adding, for example, phosphorus, or boron to the silicon oxide.

The conductive pattern 9 is formed, for example, from metal materials such as aluminum and copper. To be specific, the conductive pattern 9 is formed, for example, into a predetermined pattern by a known printing method, and is embedded in the insulating layer 8.

Such a conductive pattern 9 is electrically connected to an external member to transmit electrical signals obtained in the light-receiving device 10 (described later).

The light-receiving substrate 7 is a substrate made of, for example, silicone resin, and is provided so as to be in contact with the circuit board 6.

The light-receiving substrate 7 includes a light-receiving device 10.

The light-receiving device 10 is a photoelectric conversion device that converts received light to electrical signals, and is formed into a generally rectangular shape when viewed in cross section.

A plurality (three) of the light-receiving devices 10 are provided to correspond to the color filters 5, and the light-receiving devices 10 are embedded in the light-receiving substrate 7 so as to face the color filters 5 (green filter 5G, red filter 5R, and blue filter 5B).

One side face of the light-receiving device 10 is exposed from the light-receiving substrate 7, and the light-receiving device 10 is disposed so that the one side face faces the other side face (side face that is in contact with the circuit board 6) opposite to one side face of the color filter 5 (green filter 5G, red filter 5R, and blue filter 5B).

The light-receiving substrate 7 includes a reverse face disposed at an opposite side of the light incident plane, the reverse face being the other side face with respect to the front face (face at which the light-receiving substrate 7 and the circuit board 6 are in contact) at the side of the light incident plane of the light-collecting lens 4. The reverse face (reverse face of the imaging device 2) of the light-receiving substrate 7 is formed into a flat plane, and a thermal conductive sheet 3 is provided on this reverse face.

The thermal conductive sheet 3 is formed into a flat plate shape, and the front face thereof is disposed so as to be in close contact with the reverse face (reverse face of the imaging device 2) of the light-receiving substrate 7.

This thermal conductive sheet 3 contains boron nitride particles.

To be specific, the thermal conductive sheet 3 contains boron nitride (BN) particles as an essential component, and further contains, for example, a resin component.

The boron nitride particles are formed into a plate (or flakes), and are dispersed in a manner such that the boron nitride particles are oriented in a predetermined direction (described later) in the thermal conductive sheet 3.

The boron nitride particles have an average length in the longitudinal direction (maximum length in the direction perpendicular to the plate thickness direction) of, for example, 1 to 100 μm, or preferably 3 to 90 μm. The boron nitride particles have an average length in the longitudinal direction of, 5 μm or more, preferably 10 μm or more, more preferably 20 μm or more, even more preferably 30 μm or more, or most preferably 40 μm or more, and usually has an average length in the longitudinal direction of, for example, 100 μm or less, or preferably 90 μm or less.

The average thickness (the length in the thickness direction of the plate, that is, the length in the short-side direction of the particles) of the boron nitride particles is, for example, 0.01 to 20 μm, or preferably 0.1 to 15 μm.

The aspect ratio (length in the longitudinal direction/thickness) of the boron nitride particles is, for example, 2 to 10000, or preferably 10 to 5000.

The average particle size of the boron nitride particles as measured by a light scattering method is, for example, 5 μm or more, preferably 10 μm or more, more preferably 20 μm or more, particularly preferably 30 μm or more, or most preferably 40 μm or more, and usually 100 μm or less.

The average particle size as measured by the light scattering method is a volume average particle size measured with a dynamic light scattering particle size distribution analyzer.

When the average particle size of the boron nitride particles as measured by the light scattering method is below the above-described range, the thermal conductive sheet 3 may become fragile, and handleability may be reduced.

The bulk density (JIS K 5101, apparent density) of the boron nitride particles is, for example, 0.3 to 1.5 g/cm$^3$, or preferably 0.5 to 1.0 g/cm$^3$.

As the boron nitride particles, a commercially available product or processed goods thereof can be used. Examples of commercially available products of the boron nitride particles include the "PT" series (for example, "PT-110") manufactured by Momentive Performance Materials Inc., and the "SHOBN®UHP" series (for example, "SHOBN®UHP-1") manufactured by Showa Denko K.K.

The resin component is a component that is capable of dispersing the boron nitride particles, that is, a dispersion medium (matrix) in which the boron nitride particles are dispersed, including, for example, resin components such as a thermosetting resin component and a thermoplastic resin component.

Examples of the thermosetting resin component include epoxy resin, thermosetting polyimide, phenol resin, urea resin, melamine resin, unsaturated polyester resin, diallyl phthalate resin, silicone resin, and thermosetting urethane resin.

Examples of the thermoplastic resin component include polyolefin (for example, polyethylene, polypropylene, and ethylene-propylene copolymer), acrylic resin (for example, polymethyl methacrylate), polyvinyl acetate, ethylene-vinyl acetate copolymer, polyvinyl chloride, polystyrene, polyacrylonitrile, polyamide, polycarbonate, polyacetal, polyethylene terephthalate, polyphenylene oxide, polyphenylene sulfide, polysulfone, polyether sulfone, poly ether ether ketone, polyallylsulfone, thermoplastic polyimide, thermoplastic urethane resin, polyamino-bismaleimide, polyamideimide, polyether-imide, bismaleimide-triazine resin, polymethylpentene, fluorine resin, liquid crystal polymer, olefin-vinyl alcohol copolymer, ionomer, polyarylate, acrylonitrile-ethylene-styrene copolymer, acrylonitrile-butadiene-styrene copolymer, and acrylonitrile-styrene copolymer.

These resin components can be used alone or in combination of two or more.

Of the thermosetting resin components, preferably, the epoxy resin is used.

The epoxy resin is in the form of liquid, semi-solid, or solid under normal temperature.

To be specific, examples of the epoxy resin include aromatic epoxy resins such as bisphenol epoxy resin (for example, bisphenol A epoxy resin, bisphenol F epoxy resin, bisphenol S epoxy resin, hydrogenated bisphenol A epoxy resin, dimer acid-modified bisphenol epoxy resin, and the like), novolak epoxy resin (for example, phenol novolak epoxy resin, cresol novolak epoxy resin, biphenyl epoxy resin, and the like), naphthalene epoxy resin, fluorene epoxy resin (for example, bisaryl fluorene epoxy resin and the like), and triphenylmethane epoxy resin (for example, trishydroxyphenylmethane epoxy resin and the like); nitrogen-containing-cyclic epoxy resins such as triepoxypropyl isocyanurate (triglycidyl isocyanurate) and hydantoin epoxy resin; aliphatic epoxy resin; alicyclic epoxy resin (for example, dicyclo ring-type epoxy resin and the like); glycidylether epoxy resin; and glycidylamine epoxy resin.

These epoxy resins can be used alone or in combination of two or more.

Preferably, a combination of a liquid epoxy resin and a solid epoxy resin is used, or more preferably, a combination of a liquid aromatic epoxy resin and a solid aromatic epoxy resin is used. To be more specific, a combination of a liquid bisphenol epoxy resin and a solid triphenylmethane epoxy resin is used, or a combination of a liquid bisphenol epoxy resin and a solid bisphenol epoxy resin is used.

Preferably, a semi-solid epoxy resin is used alone, or more preferably, a semi-solid aromatic epoxy resin is used alone. Examples of those epoxy resins include, in particular, a semi-solid fluorene epoxy resin.

A combination of a liquid epoxy resin and a solid epoxy resin, or a semi-solid epoxy resin can improve conformability to irregularities (described later) of the thermal conductive sheet 3.

The epoxy resin has an epoxy equivalent of, for example, 100 to 1000 g/eqiv., or preferably 160 to 700 g/eqiv., and has a softening temperature (ring and ball test) of, for example, 80° C. or less (to be specific, 20 to 80° C.), or preferably 70° C. or less (to be specific, 25 to 70° C.).

The epoxy resin has a melt viscosity at 80° C. of, for example, 10 to 20,000 mPa·s, or preferably 50 to 15,000 mPa·s. When two or more epoxy resins are used in combination, the melt viscosity of the mixture of these epoxy resins is set within the above-described range.

Furthermore, when an epoxy resin that is solid under normal temperature and an epoxy resin that is liquid under normal temperature are used in combination, a first epoxy resin having a softening temperature of for example, below 45° C., or preferably 35° C. or less, and a second epoxy resin having a softening temperature of, for example, 45° C. or more, or preferably 55° C. or more are used in combination. In this way, the kinetic viscosity (in conformity with JIS K 7233, described later) of the resin component (mixture) can be set to a desired range, and also, conformability to irregularities of the thermal conductive sheet 3 can be improved.

The epoxy resin can also contain, for example, a curing agent and a curing accelerator, so as to be prepared as an epoxy resin composition.

The curing agent is a latent curing agent (epoxy resin curing agent) that can cure the epoxy resin by heating, and examples thereof include an imidazole compound, an amine compound, an acid anhydride compound, an amide compound, a hydrazide compound, and an imidazoline compound. In addition to the above-described compounds, a phenol compound, a urea compound, and a polysulfide compound can also be used.

Examples of the imidazole compound include 2-phenyl imidazole, 2-methyl imidazole, 2-ethyl-4-methyl imidazole, and 2-phenyl-4-methyl-5-hydroxymethyl imidazole.

Examples of the amine compound include aliphatic polyamines such as ethylene diamine, propylene diamine, diethylene triamine, and triethylene tetramine; and aromatic polyamines such as metha phenylenediamine, diaminodiphenyl methane, and diaminodiphenyl sulfone.

Examples of the acid anhydride compound include phthalic anhydride, maleic anhydride, tetrahydrophthalic anhydride, hexahydrophthalic anhydride, 4-methyl-hexahydrophthalic anhydride, methyl nadic anhydride, pyromelletic anhydride, dodecenylsuccinic anhydride, dichloro succinic anhydride, benzophenone tetracarboxylic anhydride, and chlorendic anhydride.

Examples of the amide compound include dicyandiamide and polyamide.

An example of the hydrazide compound includes adipic acid dihydrazide.

Examples of the imidazoline compound include methylimidazoline, 2-ethyl-4-methylimidazoline, ethylimidazoline, isopropylimidazoline, 2,4-dimethylimidazoline, phenylimidazoline, undecylimidazoline, heptadecylimidazoline, and 2-phenyl-4-methylimidazoline.

These curing agents can be used alone or in combination of two or more.

A preferable example of the curing agent is an imidazole compound.

Examples of the curing accelerator include tertiary amine compounds such as triethylenediamine and tri-2,4,6-dimethylaminomethylphenol; phosphorus compounds such as triphenylphosphine, tetraphenylphosphonium tetraphenylborate, and tetra-n-butylphosphonium-o, o-diethylphosphorodithioate; a quaternary ammonium salt compound; an organic metal salt compound; and derivatives thereof. These curing accelerators can be used alone or in combination of two or more.

In the epoxy resin composition, the mixing ratio of the curing agent is, for example, 0.5 to 50 parts by mass, or preferably 1 to 10 parts by mass per 100 parts by mass of the epoxy resin, and the mixing ratio of the curing accelerator is, for example, 0.1 to 10 parts by mass, or preferably 0.2 to 5 parts by mass per 100 parts by mass of the epoxy resin.

The above-described curing agent, and/or the curing accelerator can be prepared and used, as necessary, as a solution, i.e., the curing agent and/or the curing accelerator dissolved in a solvent; and/or as a dispersion liquid, i.e., the curing agent and/or the curing accelerator dispersed in a solvent.

Examples of the solvent include organic solvents including ketones such as acetone and methyl ethyl ketone, ester such as ethyl acetate, and amide such as N,N-dimethylformamide. Examples of the solvent also include aqueous solvents including water, and alcohols such as methanol, ethanol, propanol, and isopropanol. A preferable example is an organic solvent, and more preferable examples are ketones and amides.

Of the thermoplastic resin component, preferably, polyolefin is used.

Preferable examples of polyolefin are polyethylene and ethylene-propylene copolymer.

Examples of polyethylene include a low density polyethylene and a high density polyethylene.

Examples of ethylene-propylene copolymer include a random copolymer, a block copolymer, or a graft copolymer of ethylene and propylene.

These polyolefins can be used alone or in combination of two or more.

The polyolefins have a weight average molecular weight and/or a number average molecular weight of, for example, 1000 to 10000.

The polyolefin can be used alone, or can be used in combination of two or more.

The resin component has a kinetic viscosity as measured in conformity with the kinetic viscosity test of JIS K 7233 (bubble viscometer method) (temperature: 25° C.±0.5° C., solvent: butyl carbitol, resin component (solid content) concentration: 40 mass %) of, for example, $0.22 \times 10^{-4}$ to $2.00 \times 10^{-4}$ m$^2$/s, preferably $0.3 \times 10^{-4}$ to $1.9 \times 10^{-4}$ m$^2$/s, or more preferably $0.4 \times 10^{-4}$ to $1.8 \times 10^{-4}$ m$^2$/s. The above-described kinetic viscosity can be set to, for example, $0.22 \times 10^{-4}$ to $1.00 \times 10^{-4}$ m$^2$/s, preferably $0.3 \times 10^{-4}$ to $0.9 \times 10^{-4}$ m$^2$/s, or more preferably $0.4 \times 10^{-4}$ to $0.8 \times 10^{-4}$ m$^2$/s.

When the kinetic viscosity of the resin component exceeds the above-described range, excellent flexibility and conformability to irregularities (described later) may not be given to the thermal conductive sheet 3. On the other hand, when the kinetic viscosity of the resin component is below the above-described range, boron nitride particles may not be oriented in a predetermined direction.

In the kinetic viscosity test in conformity with JIS K 7233 (bubble viscometer method), the kinetic viscosity of the resin component is measured by comparing the bubble rising speed of the resin component sample with the bubble rising speed of criteria samples (having a known kinetic viscosity), and determining the kinetic viscosity of the criteria sample having a matching rising speed to be the kinetic viscosity of the resin component.

In the thermal conductive sheet 3, the proportion of the volume-based boron nitride particle content (solid content, that is, the volume percentage of boron nitride particles relative to a total volume of the resin component and the boron nitride particles) is, for example, 35 vol % or more, preferably 60 vol % or more, or more preferably 65 vol % or more, and usually, for example, 95 vol % or less, or preferably 90 vol % or less.

When the proportion of the volume-based boron nitride particle content is below the above-described range, the boron nitride particles may not be oriented in a predetermined direction in the thermal conductive sheet 3. On the other hand, when the proportion of the volume-based boron nitride particle content exceeds the above-described range, the thermal conductive sheet 3 may become fragile, and handleability and conformability to irregularities may be reduced.

The mixing ratio by mass of the boron nitride particles relative to 100 parts by mass of the total amount of the components (boron nitride particles and resin component) (total solid content) forming the thermal conductive sheet 3 is, for example, 40 to 95 parts by mass, or preferably 65 to 90 parts by mass, and the mixing ratio by mass of the resin component relative to 100 parts by mass of the total amount of the components forming the thermal conductive sheet 3 is, for example, 5 to 60 parts by mass, or preferably 10 to 35 parts by mass. The mixing ratio by mass of the boron nitride particles relative to 100 parts by mass of the resin component is, for example, 60 to 1900 parts by mass, or preferably 185 to 900 parts by mass.

When two epoxy resins (a first epoxy resin and a second epoxy resin) are used in combination, the ratio (mass of the first epoxy resin/mass of the second epoxy resin) by mass of the first epoxy resin relative to the second epoxy resin can be set appropriately in accordance with the softening temperature and the like of the epoxy resins (the first epoxy resin and the second epoxy resin). For example, the ratio of the first epoxy resin relative to the second epoxy resin by mass is 1/99 to 99/1, or preferably 10/90 to 90/10.

In the resin component, in addition to the above-described components (polymer), for example, a polymer precursor (for example, a low molecular weight polymer including oligomer), and/or a monomer are contained.

Next, a method for forming the thermal conductive sheet 3 is described.

In this method, first, the above-described components are blended at the above-described mixing ratio and are stirred and mixed, thereby preparing a mixture.

In the stirring and mixing, in order to mix the components efficiently, for example, the solvent may be blended therein with the above-described components, or, for example, the resin component (preferably, the thermoplastic resin component) can be melted by heating.

Examples of the solvent include the above-described organic solvents. When the above-described curing agent and/or the curing accelerator are prepared as a solvent solution and/or a solvent dispersion liquid, the solvent of the solvent solution and/or the solvent dispersion liquid can also serve as a mixing solvent for the stirring and mixing without adding the solvent during the stirring and mixing. Or, in the stirring and mixing, a solvent can be further added as a mixing solvent.

In the case when the stirring and mixing is performed using a solvent, the solvent is removed after the stirring and mixing.

To remove the solvent, for example, the mixture is allowed to stand at room temperature for 1 to 48 hours; heated at 40 to 100° C. for 0.5 to 3 hours; or heated under a reduced pressure atmosphere of, for example, 0.001 to 50 kPa, at 20 to 60° C., for 0.5 to 3 hours.

When the resin component is to be melted by heating, the heating temperature is, for example, a temperature in the neighborhood of or exceeding the softening temperature of the resin component, to be specific, 40 to 150° C., or preferably 70 to 140° C.

Next, in this method, the obtained mixture is hot-pressed.

To be specific, as shown in FIG. 2 (*a*), as necessary, for example, the mixture is hot-pressed with two releasing films 16 sandwiching the mixture, thereby producing a pressed sheet 3A. Conditions for the hot-pressing are as follows: a temperature of, for example, 50 to 150° C., or preferably 60 to 140° C.; a pressure of, for example, 1 to 100 MPa, or preferably 5 to 50 MPa; and a duration of, for example, 0.1 to 100 minutes, or preferably 1 to 30 minutes.

More preferably, the mixture is hot-pressed under vacuum. The degree of vacuum in the vacuum hot-pressing is, for example, 1 to 100 Pa, or preferably 5 to 50 Pa, and the temperature, the pressure, and the duration are the same as those described above for the hot-pressing.

When the temperature, the pressure, and/or the duration in the hot-pressing is outside the above-described range, there is a case where a porosity P (described later) of the thermal conductive sheet 3 cannot be adjusted to give a desired value.

The pressed sheet 3A obtained by the hot-pressing has a thickness of for example, 50 to 1000 μm, or preferably 100 to 800 μm.

Next, in this method, as shown in FIG. 2 (*b*), the pressed sheet 3A is divided into a plurality of pieces (for example, four pieces), thereby producing a divided sheet 3B (dividing step). In the division of the pressed sheet 3A, the pressed sheet 3A is cut along the thickness direction so that the pressed sheet 3A is divided into a plurality of pieces when the pressed sheet 3A is projected in the thickness direction. The pressed sheet 3A is cut so that the respective divided sheets 3B have the same shape when the divided sheets 3B are projected in the thickness direction.

Next, in this method, as shown in FIG. 2(*c*), the respective divided sheets 3B are laminated in the thickness direction, thereby producing a laminated sheet 3C (laminating step).

Thereafter, in this method, as shown in FIG. 2(*a*), the laminated sheet 3C is hot-pressed (preferably hot-pressed under vacuum) (hot-pressing step). The conditions for the hot-pressing are the same as the conditions for the hot-pressing of the above-described mixture.

The thickness of the hot-pressed laminated sheet 3C is, for example, 1 mm or less, or preferably 0.8 mm or less, and usually is, for example, 0.05 mm or more, or preferably 0.1 mm or more.

Thereafter, as shown in FIG. 3, the series of the steps of the above-described dividing step (FIG. 2(*b*)), laminating step (FIG. 2 (*c*)), and hot-pressing step (FIG. 2 (*a*)) are performed repeatedly, so as to allow boron nitride particles 14 to be efficiently oriented in a predetermined direction in the resin component 15 in the thermal conductive sheet 3. The number of the repetition is not particularly limited, and can be set appropriately according to the charging state of the boron nitride particles. The number of the repetition is, for example, 1 to 10 times, or preferably 2 to 7 times.

In the above-described hot-pressing step (FIG. 2 (*a*)), for example, a plurality of calendering rolls and the like can also be used for rolling the mixture and the laminated sheet 3C.

The thermal conductive sheet 3 shown in FIG. 2 and FIG. 3 can be formed in this manner.

The thermal conductive sheet 3 thus formed has a thickness of, for example, 1 mm or less, or preferably 0.8 mm or less, and usually has a thickness of, for example, 0.05 mm or more, or preferably 0.1 mm or more.

In the thermal conductive sheet 3, the proportion of the volume-based boron nitride particle 14 content (solid content, that is, volume percentage of boron nitride particles 14 relative to the total volume of the resin component 15 and the boron nitride particles 14) is, as described above, for example, 35 vol % or more (preferably 60 vol % or more, or more preferably 75 vol % or more), and usually 95 vol % or less (preferably 90 vol % or less).

When the proportion of the boron nitride particle 14 content is below the above-described range, the boron nitride particles 14 may not be oriented in a predetermined direction in the thermal conductive sheet 3.

When the resin component 15 is the thermosetting resin component, for example, the series of the steps of the above-described dividing step (FIG. 2 (*b*)), laminating step (FIG. 2 (*c*)), and hot-pressing step (FIG. 2 (*a*)) are performed repeatedly for an uncured thermal conductive sheet 3, thereby producing an uncured thermal conductive sheet 3 as is. The uncured thermal conductive sheet 3 is cured by heating, as necessary, after the thermal conductive adhesive sheet 3 is provided in the imaging device module 1.

In the thus formed thermal conductive sheet 3, as shown in FIG. 3 and its partially enlarged schematic view, the longitudinal direction LD of the boron nitride particle 14 is oriented along a plane (surface) direction SD that crosses (is perpendicular to) the thickness direction TD of the thermal conductive sheet 3.

The calculated average of the angle formed between the longitudinal direction LD of the boron nitride particle 14 and a plane direction SD of the thermal conductive sheet 3 (orientation angle α of the boron nitride particles 14 relative to the thermal conductive sheet 3) is, for example, 25 degrees or less, or preferably 20 degrees or less, and usually 0 degree or more.

The orientation angle α of the boron nitride particle 14 relative to the thermal conductive sheet 3 is obtained as follows: the thermal conductive sheet 3 is cut along the thickness direction with a cross section polisher (CP); the cross section thus appeared is photographed with a scanning electron microscope (SEM) at a magnification that enables observation of 200 or more boron nitride particles 14 in the field of view; a tilt angle α between the longitudinal direction LD of the boron nitride particle 14 and the plane direction SD (direction perpendicular to the thickness direction TD) of the thermal conductive sheet 3 is obtained from the obtained SEM photograph; and the average value of the tilt angles α is calculated.

Thus, the thermal conductivity in the plane direction SD of the thermal conductive sheet 3 is 4 W/m·K or more, preferably 5 W/m·K or more, more preferably 10 W/m·K or more, even more preferably 15 W/m·K or more, or particularly preferably 25 W/m·K or more, and usually 200 W/m·K or less.

The thermal conductivity in the plane direction SD of the thermal conductive sheet 3 is substantially the same before and after the curing by heat when the resin component 15 is the thermosetting resin component.

When the thermal conductivity in the plane direction SD of the thermal conductive sheet 3 is below the above-described range, thermal conductivity in the plane direction SD is insufficient, and therefore there is a case where the thermal conductive sheet 3 cannot be used for heat dissipation that requires thermal conductivity in such a plane direction SD.

The thermal conductivity in the plane direction SD of the thermal conductive sheet 3 is measured by a pulse heating method. In the pulse heating method, the xenonflash analyzer "LFA-447" (manufactured by Erich NETZSCH GmbH & Co. Holding KG) is used.

The thermal conductivity in the thickness direction TD of the thermal conductive sheet 3 is, for example, 0.5 to 15 W/m·K, or preferably 1 to 10 W/m·K.

The thermal conductivity in the thickness direction TD of the thermal conductive sheet 3 is measured by a pulse heating method, a laser flash method, or a TWA method. In the pulse heating method, the above-described device is used, in the laser flash method, "TC-9000" (manufactured by Ulvac, Inc.) is used, and in the TWA method, "ai-Phase mobile" (manufactured by ai-Phase Co., Ltd) is used.

Thus, the ratio of the thermal conductivity in the plane direction SD of the thermal conductive sheet 3 relative to the thermal conductivity in the thickness direction TD of the thermal conductive sheet 3 (thermal conductivity in the plane direction SD/thermal conductivity in the thickness direction TD) is, for example, 1.5 or more, preferably 3 or more, or more preferably 4 or more, and usually 20 or less.

Although not shown in FIG. 2, for example, pores (gaps) are formed in the thermal conductive sheet 3.

The proportion of the pores in the thermal conductive sheet 3, that is, a porosity P, can be adjusted by setting the proportion of the boron nitride particle 14 content (volume-based), and further setting the temperature, the pressure, and/or the duration at the time of hot pressing the mixture of the boron nitride particle 14 and the resin component 15 (FIG. 2(a)). To be specific, the porosity P can be adjusted by setting the temperature, the pressure, and/or the duration of the hot pressing (FIG. 2(a)) within the above-described range.

The porosity P of the thermal conductive sheet 3 is, for example, 30 vol % or less, or preferably 10 vol % or less.

The porosity P is measured by, for example, as follows: the thermal conductive sheet 3 is cut along the thickness direction with a cross section polisher (CP); the cross section thus appeared is observed with a scanning electron microscope (SEM) at a magnification of 200 to obtain an image; the obtained image is binarized based on the pore portion and the non-pore portion; and the area ratio, i.e., the ratio of the pore portion area to the total area of the cross section of the thermal conductive sheet 3 is determined by calculation.

The thermal conductive sheet 3 has a porosity P2 after curing of, relative to a porosity P1 before curing, for example, 100% or less, or preferably 50% or less.

For the measurement of the porosity P (P1), when the resin component 15 is a thermosetting resin component, the thermal conductive sheet 3 before curing by heat is used.

When the porosity P of the thermal conductive sheet 3 is within the above-described range, the conformability to irregularities (described later) of the thermal conductive sheet 3 can be improved.

When the thermal conductive sheet 3 is evaluated, for example, in the bend test in conformity with the cylindrical mandrel method of JIS K 5600-5-1 under the test conditions shown below, preferably, no fracture is observed.

Figure 5:
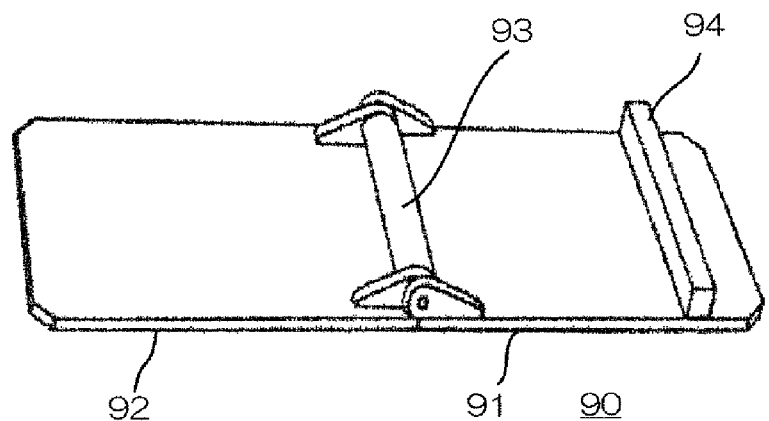
FIG. 5 shows a perspective view of a test device (Type I, before bend test) of a bend test.
Figure 6:
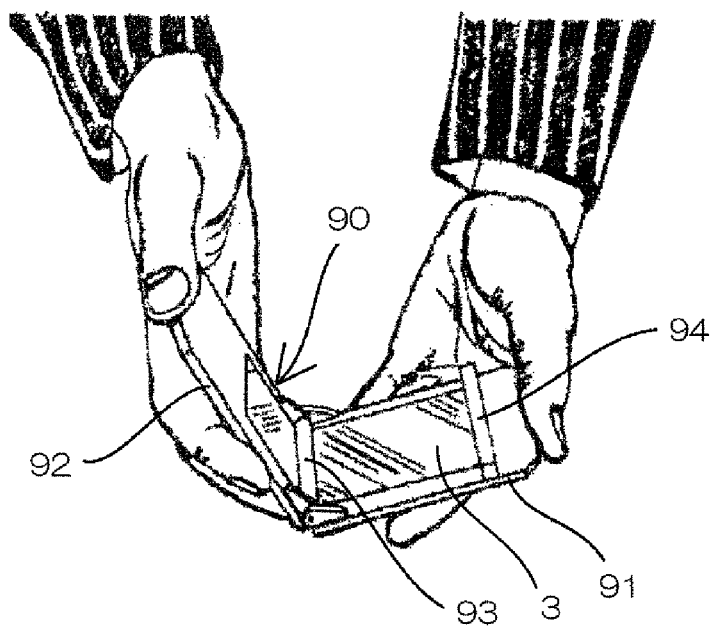
FIG. 6 shows a perspective view of a test device (Type I, during bend test) of a bend test.

Test Conditions:
Test Device: Type I
Mandrel: diameter 10 mm
Bending Angle: 90 degrees or more
Thickness of the thermal conductive sheet 3: 0.3 mm FIGS. 5 and 6 show perspective views of the Type I test device. In the following, the Type I test device is described.

In FIGS. 5 and 6, a Type I test device 90 includes a first flat plate 91; a second flat plate 92 disposed in parallel with the first flat plate 91; and a mandrel (rotation axis) 93 provided for allowing the first flat plate 91 and the second flat plate 92 to rotate relatively.

The first flat plate 91 is formed into a generally rectangular flat plate. A stopper 94 is provided at one end portion (free end portion) of the first flat plate 91. The stopper 94 is formed on the surface of the first flat plate 91 so as to extend along the one end portion of the first flat plate 91.

The second flat plate 92 is formed into a generally rectangular flat plate, and one side thereof is disposed so as to be adjacent to one side (the other end portion (proximal end portion) that is opposite to the one end portion where the stopper 94 is provided) of the first flat plate 91.

The mandrel 93 is formed so as to extend along one side of the first flat plate 91 and one side of the second flat plate 92 that are adjacent to each other.

In the Type I test device 90, as shown in FIG. 5, the surface of the first flat plate 91 is flush with the surface of the second flat plate 92 before the start of the bend test.

To perform the bend test, the thermal conductive sheet 3 is placed on the surface of the first flat plate 91 and the surface of the second flat plate 92. The thermal conductive sheet 3 is placed so that one side of the thermal conductive sheet 3 is in contact with the stopper 94.

Then, as shown in FIG. 6, the first flat plate 91 and the second flat plate 92 are rotated relatively. In particular, the free end portion of the first flat plate 91 and the free end portion of the second flat plate 92 are rotated to a predetermined angle with the mandrel 93 as the center. To be specific, the first flat plate 91 and the second flat plate 92 are rotated so as to bring the surface of the free end portions thereof closer (oppose each other).

In this way, the thermal conductive sheet 3 is bent with the mandrel 93 as the center, conforming to the rotation of the first flat plate 91 and the second flat plate 92.

More preferably, no fracture is observed in the thermal conductive sheet 3 even when the bending angle is set to 180 degrees under the above-described test conditions.

When the resin component 15 is the thermosetting resin component, a semi-cured (in B-stage) thermal conductive sheet 3 is tested in the bend test.

When the fracture is observed in the bend test with the above-described bending angle in the thermal conductive sheet 3, there is a case where excellent flexibility cannot be given to the thermal conductive sheet 3.

Furthermore, for example, when the thermal conductive sheet 3 is evaluated in the 3-point bending test in conformity with JIS K 7171 (2008) under the test conditions shown below, no fracture is observed.

Test Conditions:
Test piece: size 20 mm×15 mm
Distance between supporting points: 5 mm
Testing speed: 20 mm/min (indenter depressing speed)
Bending angle: 120 degrees
Evaluation method: presence or absence of fracture such as cracks at the center of the test piece is observed visually when tested under the above-described test conditions.

In the 3-point bending test, when the resin component 3 is a thermosetting resin component, the thermal conductive sheet 3 before curing by heat is used.

Therefore, the thermal conductive sheet 15 is excellent in conformability to irregularities because no fracture is observed in the above-described 3-point bending test. The conformability to irregularities is, when the thermal conductive sheet 3 is provided on an object with irregularities, a property of the thermal conductive sheet 3 that conforms to be in close contact with the irregularities.

A mark such as, for example, letters and symbols can be adhered to the thermal conductive sheet 3. That is, the thermal conductive sheet 3 is excellent in mark adhesion. The mark adhesion is a property of the thermal conductive sheet 3 that allows reliable adhesion of the above-described mark thereon.

The mark can be adhered (applied, fixed, or firmly fixed) to the thermal conductive sheet 3, to be specific, by printing, engraving, or the like.

Examples of printing include, for example, inkjet printing, relief printing, intaglio printing, and laser printing.

When the mark is to be printed by inkjet printing, relief printing, or intaglio printing, for example, an ink fixing layer for improving mark's fixed state can be provided on the surface (printing side) of the thermal conductive sheet 3.

When the mark is to be printed by laser printing, for example, a toner fixing layer for improving mark's fixed state can be provided on the surface (printing side) of the thermal conductive sheet 3.

Examples of engraving include laser engraving, and punching.

The thus obtained thermal conductive sheet 3 usually is insulative.

Although there is no particular limitation on how such an imaging device module 1 is obtained, for example, first, the imaging device 2 is produced, and thereafter, the thermal conductive sheet 3 is bonded to the reverse face of the obtained imaging device 2.

The method for producing the imaging device 2 is not particularly limited, and a known method can be used.

To be more specific, although not shown, for example, the light-receiving device 10 is embedded in the light-receiving substrate 7 by a known method, and then, the insulating layer 8 and the conductive pattern 9 are laminated sequentially, thereby forming the circuit board 6 on the light-receiving substrate 7. Thereafter, the color filter 5 and the light-collecting lens 4 are mounted on the circuit board 6. The imaging device 2 can be obtained in this manner.

Next, in this method, the thermal conductive sheet 3 is bonded to the reverse face of the obtained imaging device 2.

When the resin component 15 is a thermosetting resin component in the thermal conductive sheet 3, preferably, a thermal conductive sheet 3 in B-stage is bonded to the reverse face of the imaging device 2. The imaging device module 1 can be obtained in this manner.

Although not shown, when the thermal conductive sheet 3 is in B-stage in this imaging device module 1, as necessary, the imaging device module 1 can be heated so that the thermal conductive sheet 3 is cured by heating. The timing and conditions for the curing by heating can be determined appropriately according to purposes and use.

Furthermore, although not shown, in this imaging device module 1, as necessary, a diverging lens, an optical waveguide member, and the like can be disposed appropriately.

Such an imaging device module 1 is mounted in imaging apparatuses such as digital cameras and digital camcorders.

In the imaging device module 1 of the imaging apparatus, light incident on the light incident plane (light incident plane of the light-collecting lens 4) is collected by the light-collecting lens 4, and the collected light is transmitted through the color filter 5 (the green filter 5G, the red filter 5R, or the blue filter 5B) and the insulating layer 8 portion of the circuit board 6. The light reaches the light-receiving substrate 7 (light-receiving device 10) in this manner.

The light that reached the light-receiving substrate 7 is converted to an electrical signal in the light-receiving device 10; and the electrical signal is transmitted through the conductive pattern 9, and used in an external member, which is not shown.

At this time, there is a case where heat is generated in the imaging device 2, for example, in the circuit board 6 and in the light-receiving substrate 7. A high temperature sometimes causes a trouble such as noise generation in the imaging device 2, and such temperature conditions may change the sensitivity.

In contrast, in the imaging device module 1, a thermal conductive sheet 3 is provided at the reverse face that is opposite to the light incident plane of the imaging device 2. To be specific, a thermal conductive sheet 3 containing plate-like boron nitride particles, and having a thermal conductivity of 4 W/m·K or more in a direction perpendicular to the thickness direction (that is, the plane direction where the reverse face of the light-receiving substrate 7 extends) is provided. Therefore, the heat generated from the reverse face of the light-receiving substrate 7 is dissipated uniformly in the plane direction, thereby reducing temperature nonuniformity (achieves uniform temperature), while ensuring excellent heat dissipation. As a result, improvement in sensitivity can be achieved.

Also, because this thermal conductive sheet 3 is produced at a cost cheaper than that of a graphite sheet, cost reduction can be achieved.

Furthermore, because graphite sheets are conductive, a problem is caused. For example, when a graphite sheet is chipped, the chipped piece causes a short circuit inside the imaging apparatus.

However, because such a thermal conductive sheet 3 is insulative, even when a chipped portion is generated inside the imaging apparatus (not shown), generation of a short circuit can be prevented.

Figure 4:
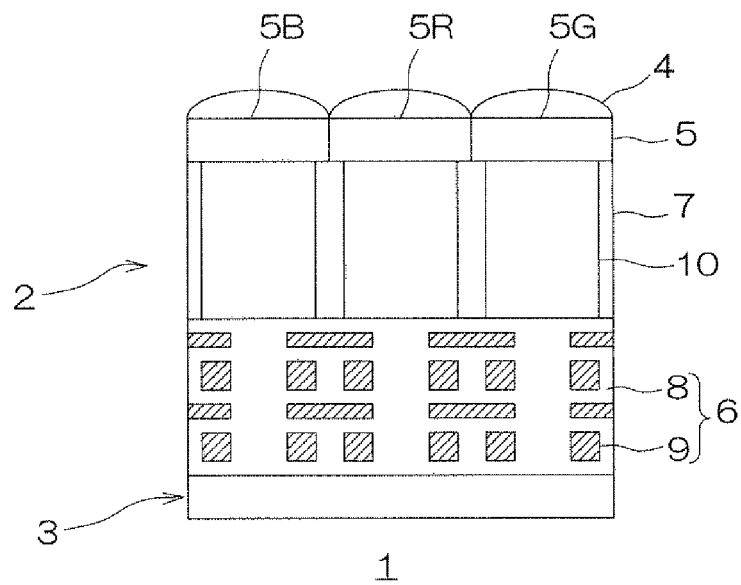
FIG. 4 is a schematic diagram illustrating the configuration of another embodiment of the imaging device module of the present invention.

FIG. 4 is a schematic diagram illustrating the configuration of another embodiment of the imaging device module 1 of the present invention.

The same reference numerals are used in FIG. 4 for those members corresponding to the above-described members, and detailed descriptions thereof are omitted.

A front-illuminated CMOS image sensor is used as the imaging device 2 in the description above, and in the front-illuminated CMOS image sensor, the circuit board 6 is disposed below the light-collecting lens 4 and the color filter 5, and the light-receiving substrate 7 is disposed below the circuit board 6. However, a known back-illuminated CMOS image sensor can also be used as the imaging device 2.

To be more specific, in this embodiment, as shown in FIG. 4, the light-receiving substrate 7 is disposed below the light-collecting lens 4 and the color filter 5, and the circuit board 6 is disposed below the light-receiving substrate 7.

In the light-receiving substrate 7, usually, for example, silicone resin and the like are removed so as to achieve a small thickness.

In this imaging device module 1, the thermal conductive sheet 3 is bonded to the reverse face (reverse face of the imaging device 2) of the circuit board 6.

With such an imaging device module 1 as well, as the above-described example, excellent heat dissipation can be ensured, uniform temperature can be achieved, and furthermore, cost reduction can be achieved.

In addition, because such an imaging device module 1 uses a back-illuminated CMOS image sensor as the imaging device 2, the efficiency of light reaching the light-receiving substrate 7 (light-receiving device 10) is improved, and sensitivity is improved.

That is, with an imaging device module 1 (ref: FIG. 1) in which a front-illuminated CMOS image sensor is used as the imaging device 2, light incident on the light incident plane is transmitted through the circuit board 6 before reaching the light-receiving substrate 7 (light-receiving device 10). Therefore, the light is reflected by the conductive pattern 9 in the circuit board 6, and there is a case where efficiency of light reaching the light-receiving substrate 7 (light-receiving device 10) cannot be ensured sufficiently.

However, with the imaging device module 1 (ref: FIG. 4) in which the imaging device 2 is a back-illuminated CMOS image sensor, the light incident on the light incident plane reaches the light-receiving substrate 7 (light-receiving device 10) before being transmitted through the circuit board 6, the light reflection by the conductive pattern 9 can be suppressed, and efficiency of light reaching the light-receiving substrate 7 (light-receiving device 10) can be sufficiently ensured.

EXAMPLES

Hereinafter, the present invention is described in further detail with reference to Production Example, Examples, and Comparitive Examples. However, the present invention is not limited to those described in Production Example, Examples, and Comparative Examples.

Production Example 1

Production of Thermal Conductive Sheet

The components described below were blended, stirred, and allowed to stand at room temperature (23° C.) for one night, thereby allowing methyl ethyl ketone (dispersion medium for the curing agent) to volatilize and preparing a semi-solid mixture. The details of the components were as follows: 13.42 g of PT-110 (trade name, plate-like boron nitride particles, average particle size (light scattering method) 45 μm, manufactured by Momentive Performance Materials Inc.), 1.0 g of jER®828 (trade name, bisphenol A epoxy resin, first epoxy resin, liquid, epoxy equivalent 184 to 194 g/eqiv., softening temperature (ring and ball method) below 25° C., melt viscosity (80° C.) 70 mPa·s, manufactured by Japan Epoxy Resins Co., Ltd.), 2.0 g of EPPN-501HY (trade name, triphenylmethane epoxy resin, second epoxy resin, solid, epoxy equivalent 163 to 175 g/eqiv., softening temperature (ring and ball method) 57 to 63° C., manufactured by NIPPON KAYAKU Co., Ltd), and 3 g (solid content 0.15 g) (5 mass % per total amount of epoxy resins of jER®828 and EPPN-501HY) of a curing agent (a dispersion liquid of 5 mass % Curezol® 2P4 MHZ-PW (trade name, manufactured by Shikoku Chemicals Corporation.) in methyl ethyl ketone).

In the above-described blending, the volume percentage (vol %) of the boron nitride particles relative to the total volume of the solid content excluding the curing agent (that is, solid content of the boron nitride particle and epoxy resin) was 70 vol %.

Then, the obtained mixture was sandwiched by two silicone-treated releasing films, and then these were hot-pressed with a vacuum hot-press at 80° C. under an atmosphere (vacuum atmosphere) of 10 Pa with a load of 5 tons (20 MPa) for 2 minutes. A pressed sheet having a thickness of 0.3 mm was thus obtained (ref: FIG. 2 (*a*)).

Thereafter, the obtained pressed sheet was cut so as to be divided into a plurality of pieces when projected in the thickness direction of the pressed sheet. Divided sheets were thus obtained (ref: FIG. 2 (*b*)). Next, the divided sheets were laminated in the thickness direction. A laminated sheet was thus obtained (ref: FIG. 2 (*c*)).

Then, the obtained laminated sheet was hot-pressed under the same conditions as described above with the above-described vacuum hot-press (ref: FIG. 2 (*a*)).

Then, a series of the above-described operations of cutting, laminating, and hot-pressing (ref: FIG. 2) was repeated four times. A thermal conductive sheet (uncured state (in B-stage)) having a thickness of 0.3 mm was thus obtained (ref: FIG. 3).

Production Examples 2 to 9 and 11 to 16

Thermal conductive sheets were obtained in the same manner as in Production Example 1, based on the mixing ratio and the production conditions of Tables 1 to 3.

Production Example 10

A mixture was prepared by blending and stirring components (boron nitride particles and polyethylene) in accordance with the mixing formulation of Table 2. That is, during the stirring of the components, the mixture was heated to 130° C., and polyethylene was melted.

Then, the obtained mixture was sandwiched by two silicone-treated releasing films, and then these were hot-pressed with a vacuum hot-press at 120° C. under an atmosphere (vacuum atmosphere) of 10 Pa with a load of 1 ton (4 MPa) for 2 minutes. A pressed sheet having a thickness of 0.3 mm was thus obtained (ref: FIG. 2 (*a*)).

Thereafter, the obtained pressed sheet was cut so as to be divided into a plurality of pieces when projected in the thickness direction of the pressed sheet. Divided sheets were thus obtained (ref: FIG. 2 (*b*)). Next, the divided sheets were laminated in the thickness direction. A laminated sheet was thus obtained (ref: FIG. 2 (*c*)).

Then, the obtained laminated sheet was hot-pressed under the same conditions as described above with the above-described vacuum hot-press (ref: FIG. 2 (*a*)).

Then, a series of the above-described operations of cutting, laminating, and pressing (ref: FIG. 2) was repeated four times. A thermal conductive sheet having a thickness of 0.3 mm was thus obtained.

Example 1

An uncured (B-stage) thermal conductive sheet obtained in Production Example 1 was bonded to a reverse face that is disposed opposite to the light incident plane of the front-illuminated image sensor (ref: FIG. 1). Thereafter, the thermal conductive sheet was cured by heating the thermal conductive sheet and the front-illuminated image sensor at 150° C. for 120 minutes, thereby producing an imaging device module.

Examples 2 to 16

Imaging device modules of Examples 2 to 16 were produced in the same manner as in Example 1 using the thermal conductive sheets obtained in Production Examples 2 to 16.

The thermal conductive sheet obtained in Production Example 10 was heat sealed at 120° C. instead of curing by heat.

Example 17

An uncured (B-stage) thermal conductive sheet obtained in Production Example 1 was bonded to a reverse face that is disposed opposite to the light incident plane of the back-illuminated image sensor (ref: FIG. 1). Thereafter, the thermal conductive sheet was cured by heating the thermal conductive sheet and the back-illuminated image sensor at 150° C. for 120 minutes, thereby producing an imaging device module.

Examples 18 to 32

Imaging device modules of Examples 18 to 32 were produced in the same manner as in Example 17 using the thermal conductive sheets obtained in Production Examples 2 to 16.

The thermal conductive sheet obtained in Production Example 10 was heat sealed at 120° C. instead of curing by heat.

Comparative Example 1

The front-illuminated image sensor used in Example 1 was used as the imaging device module. No thermal conductive sheet was bonded to this imaging device module.

Comparative Example 2

The back-illuminated image sensor used in Example 17 was used as the imaging device module. No thermal conductive sheet was bonded to this imaging device module.

(Evaluation)

1. Thermal Conductivity

The thermal conductivity of the thermal conductive sheets of Production Examples 1 to 16 was measured.

That is, the thermal conductivity in the plane direction (SD) was measured by a pulse heating method using a xenon flash analyzer "LFA-447" (manufactured by Erich NETZSCH GmbH & Co. Holding KG).

The results are shown in Tables 1 to 3.

2. Heat Dissipation and Temperature Nonuniformity

After the imaging device modules of Examples 1 to 32 were operated, the temperature of the thermal conductive sheet was measured with an infrared camera. It was confirmed that almost no rise in temperature and temperature nonuniformity was found.

Also, after the imaging device modules of Comparative Examples 1 to 2 were operated in the same manner as described above, the temperature of the reverse face thereof was measured with an infrared camera. It was confirmed that a rise in temperature and temperature nonuniformity were found.

3. Porosity (P)

The porosity (P1) of the thermal conductive sheets before curing in Production Examples 1 to 16 was measured by the following method.

Measurement method of porosity: The thermal conductive sheet was cut along the thickness direction with a cross section polisher (CP); and the cross section thus appeared was observed with a scanning electron microscope (SEM) at a magnification of 200. The obtained image was binarized based on the pore portion and the non-pore portion; and the area ratio, i.e., the ratio of the pore portion area to the total area of the cross section of the thermal conductive sheet was calculated.

The results are shown in Tables 1 to 3.

4. Conformability to Irregularities (3-Point Bending Test)

The 3-point bending test in conformity with JIS K 7171 (2010) was carried out for the thermal conductive sheets before curing by heat of Production Examples 1 to 16 with the following test conditions, thus evaluating conformability to irregularities with the following evaluation criteria. The results are shown in Tables 1 to 3.

Test Conditions:
  Test piece: size 20 mm×15 mm
  Distance between supporting points: 5 mm
  Testing speed: 20 mm/min (indenter depressing speed)
  Bending angle: 120 degrees (Evaluation Criteria)
  Excellent: No fracture was observed.
  Good: Almost no fracture was observed.
  Bad: Fracture was clearly observed.

5. Printed Mark Visibility (Mark Adhesion by Printing: Mark Adhesion by Inkjet Printing or Laser Printing)

Marks were printed on the thermal conductive sheets of Production Examples 1 to 16 by inkjet printing and laser printing, and the marks were observed.

As a result, it was confirmed that the mark was excellently visible in both cases of inkjet printing and laser printing, and that mark adhesion by printing was excellent in any of the thermal conductive sheets of Production Examples 1 to 16.

TABLE 1

| | | | | Average Particle Size (μm) | Example | | | | | |
|---|---|---|---|---|---|---|---|---|---|---|
| | | | | | Ex. 1 | Ex. 2 | Ex. 3 | Ex. 4 | Ex. 5 | Ex. 6 |
| Mixing Formulation of Components | Boron Nitride Particle/g[*4]/ [vol %][*B]/ [vol %][*C] | PT-110[*1] | | 45 | 13.42 [70] [69] | 3.83 [40] [38.8] | 5.75 [50] [48.8] | 12.22 [68] [66.9] | 23 [80] [79.2] | — |
| | | UHP-1[*2] | | 9 | — | — | — | — | — | 12.22 [68] [66.9] |
| | Polymer | Thermosetting Resin | Epoxy Resin Composition | Epoxy Resin A[*3] (Semi-solid) | — | 3 | 3 | 3 | 3 | 3 |
| | | | | Epoxy Resin B[*4] (Liquid) | 1 | — | — | — | — | — |
| | | | | Epoxy Resin C[*5] (Solid) | — | — | — | — | — | — |
| | | | | Epoxy Resin D[*6] (Solid) | 2 | — | — | — | — | — |
| | | | | Curing Agent[*7] | — | 3 | 3 | 3 | 3 | 3 |

TABLE 1-continued

| | | | Average Particle Size (μm) | Ex. 1 | Ex. 2 | Ex. 3 | Ex. 4 | Ex. 5 | Ex. 6 |
|---|---|---|---|---|---|---|---|---|---|
| | | | (Solid Content in Grams) | | (0.15) | (0.15) | (0.15) | (0.15) | (0.15) |
| | | | Curing Agent*8 (Solid Content in Grams) | 3 (0.15) | — | — | — | — | — |
| | | Thermoplastic Resin | Polyethylene*9 | — | — | — | — | — | — |
| Production Conditions | Hot-pressing | | Temperature(°C.) | 80 | 80 | 80 | 80 | 80 | 80 |
| | | | Number of Time (times)*D | 5 | 5 | 5 | 5 | 5 | 5 |
| | | | Load (MPa)/(tons) | 20/5 | 20/5 | 20/5 | 20/5 | 20/5 | 20/5 |
| Evaluation | Thermal Conductive Sheet | Thermal Conductivity (W/m · K) | Plane Direction (SD) | 30 | 4.5 | 6.0 | 30.0 | 32.5 | 17.0 |
| | | | Thickness Direction (TD) | 2.0 | 1.3 | 3.3 | 5.0 | 5.5 | 5.8 |
| | | | Ratio(SD/TD) | 15.0 | 3.5 | 1.8 | 6.0 | 5.9 | 2.9 |
| | | | Porosity (vol %) | 4 | 0 | 0 | 5 | 12 | 6 |
| | | | Conformability to Irregularities/ 3-point bending test JIS K 7171(2008) | Excellent | Good | Good | Good | Good | Good |
| | Boron Nitride Particle | | Orientation Angle(α)(degrees) | 12 | 18 | 18 | 15 | 13 | 20 | g*A Blended Weight  
[vol %]*B Percentage relative to the total volume of the thermal conductive sheet (excluding curing agent)  
[vol %]*C Percentage relative to the total volume of the thermal conductive sheet  
Number of Time*D Number of Times of hot-pressing of the laminated sheet

TABLE 2

| | | | | Average Particle Size (μm) | Ex. 7 | Ex. 8 | Ex. 9 | Ex. 10 | Ex. 11 |
|---|---|---|---|---|---|---|---|---|---|
| Mixing Formulation of Components | Boron Nitride Particle/g*A/ [vol %]*B/ [vol %]*C | PT-110*1 | | 45 | 12.22 [68] [66.9] | 12.22 [68] [66.9] | 12.22 [68] [66.9] | 3.83 [60] [60] | 13.42 [70] [69] |
| | | UHP-1*2 | | 9 | — | — | — | — | — |
| | Polymer | Thermosetting Resin | Epoxy Resin Composition | Epoxy Resin A*3 (Semi-solid) | — | — | — | — | — |
| | | | | Epoxy Resin B*4 (Liquid) | 1.5 | 3 | — | — | — |
| | | | | Epoxy Resin C*5 (Solid) | 1.5 | — | 3 | — | — |
| | | | | Epoxy Resin D*6 (Solid) | — | — | — | — | 3 |
| | | | | Curing Agent*7 (Solid Content in Grams) | 3 (0.15) | 3 (0.15) | 3 (0.15) | — | 3 (0.15) |
| | | | | Curing Agent*8 (Solid Content in Grams) | — | — | — | — | — |
| | | Thermoplastic Resin | | Polyethylene*9 | — | — | — | 1 | — |
| Production Conditions | Hot-pressing | | | Temperature(°C.) | 80 | 80 | 80 | 120 | 80 |
| | | | | Number of Time(times)*D | 5 | 5 | 5 | 5 | 5 |
| | | | | Load(MPa)/(tons) | 20/5 | 20/5 | 20/5 | 4/1 | 20/5 |
| Evaluation | Thermal Conductive Sheet | Thermal Conductivity (W/m · K) | | Plane Direction(SD) | 30.0 | 30.0 | 30.0 | 20 | 24.5 |
| | | | | Thickness Direction(TD) | 5.0 | 5.0 | 5.0 | 2.0 | 2.1 |
| | | | | Ratio(SD/TD) | 6.0 | 6.0 | 6.0 | 10.0 | 11.7 |
| | | | | Porosity(vol %) | 4 | 2 | 13 | 1 | 10 |
| | | | | Conformability to Irregularities/ 3-point bending test JIS K 7171(2008) | Good | Good | Bad | Bad | Bad |
| | Boron Nitride Particle | | | Orientation Angle(α)(degrees) | 15 | 16 | 16 | 15 | 16 | g*A Blended Weight  
[vol %]*B Percentage relative to the total volume of the thermal conductive sheet (excluding curing agent)  
[vol %]*C Percentage relative to the total volume of the thermal conductive sheet  
Number of Time*D Number of Times of hot-pressing of the laminated sheet

TABLE 3

| | | | Average Particle Size (μm) | Example Ex. 12 | Ex. 13 | Ex. 14 | Ex. 15 | Ex. 16 |
|---|---|---|---|---|---|---|---|---|
| Mixing Formulation of Components | Boron Nitride Particle/g*A/ [vol %]*B/ [vol %]*C | PT-110*1 | 45 | 3.83 [40] [37.7] | 13.42 [70] [69] | 13.42 [70] [69] | 13.42 [70] [69] | 13.42 [70] [69] |
| | | UHP-1*2 | 9 | — | — | — | — | — |
| | Polymer | Thermosetting Resin / Epoxy Resin Composition | Epoxy Resin A*3 (Semi-solid) | 3 | 3 | 3 | 3 | 3 |
| | | | Epoxy Resin B*4 (Liquid) | — | — | — | — | — |
| | | | Epoxy Resin C*5 (Solid) | — | — | — | — | — |
| | | | Epoxy Resin D*6 (Solid) | — | — | — | — | — |
| | | | Curing Agent*7 (Solid Content in Grams) | 6 (0.3) | 3 (0.15) | 3 (0.15) | 3 (0.15) | 3 (0.15) |
| | | | Curing Agent*8 (Solid Content in Grams) | — | — | — | — | — |
| | | Thermoplastic Resin | Polyethylene*9 | — | — | — | — | — |
| Production Conditions | Hot-pressing | | Temperature(° C.) | 80 | 60 | 70 | 80 | 80 |
| | | | Number of Time(times)*D | 5 | 5 | 5 | 5 | 5 |
| | | | Load(MPa)/(tons) | 20/5 | 20/5 | 20/5 | 20/5 | 40/10 |
| Evaluation | Thermal Conductive Sheet | Thermal Conductivity (W/m·K) | Plane Direction(SD) | 4.1 | 10.5 | 11.2 | 32.5 | 50.7 |
| | | | Thickness Direction(TD) | 1.1 | 2.2 | 3.0 | 5.5 | 7.3 |
| | | | Ratio(SD/TD) | 3.7 | 4.8 | 3.7 | 5.9 | 6.9 |
| | | | Porosity(vol %) | 0 | 29 | 26 | 8 | 3 |
| | | | Conformability to Irregularities/ 3-point bending test JIS K 7171(2008) | Excellent | Excellent | Excellent | Excellent | Good |
| | Boron Nitride Particle | | Orientation Angle(α)(degrees) | 20 | 17 | 15 | 15 | 13 | g*A Blended Weight
[vol %]*B Percentage relative to the total volume of the thermal conductive sheet (excluding curing agent)
[vol %]*C Percentage relative to the total volume of the thermal conductive sheet
Number of Time*D Number of Times of hot-pressing of the laminated sheet In Tables 1 to 3, values for the components are in grams unless otherwise specified.

In the rows of "boron nitride particles" in Tables 1 to 3, values on the top represent the blended weight (g) of the boron nitride particles; values in the middle represent the volume percentage (vol %) of the boron nitride particles relative to the total volume of the solid content excluding the curing agent in the thermal conductive sheet (that is, solid content of the boron nitride particles, and epoxy resin or polyethylene); and values at the bottom represent the volume percentage (vol %) of the boron nitride particles relative to the total volume of the solid content in the thermal conductive sheet (that is, solid content of boron nitride particles, epoxy resin, and curing agent).

For the components with "*" added in Tables 1 to 3, details are given below.

PT-110*1: trade name, plate-like boron nitride particles, average particle size (light scattering method) 45 μm, manufactured by Momentive Performance Materials Inc.

UHP-1*2: trade name: SHOBN®UHP-1, plate-like boron nitride particles, average particle size (light scattering method) 9 μm, manufactured by Showa Denko K. K.

Epoxy Resin A*3: OGSOL EG (trade name), bisarylfluorene epoxy resin, semi-solid, epoxy equivalent 294 g/eqiv., softening temperature (ring and ball test) 47° C., melt viscosity (80° C.) 1360 mPa·s, manufactured by Osaka Gas Chemicals Co., Ltd.

Epoxy Resin B*4: jER® 828 (trade name), bisphenol A epoxy resin, liquid, epoxy equivalent 184 to 194 g/eqiv., softening temperature (ring and ball test) below 25° C., melt viscosity (80° C.) 70 mPa·s, manufactured by Japan Epoxy Resins Co., Ltd.

Epoxy Resin C*5: jER® 1002 (trade name), bisphenol A epoxy resin, solid, epoxy equivalent 600 to 700 g/eqiv., softening temperature (ring and ball test) 78° C., melt viscosity (80° C.) 10000 mPa·s or more (measurement limit or more), manufactured by Japan Epoxy Resins Co., Ltd.

Epoxy Resin D*6: EPPN-501HY (trade name), triphenylmethane epoxy resin, solid, epoxy equivalent 163 to 175 g/eqiv., softening temperature (ring and ball test) 57 to 63° C., manufactured by NIPPON KAYAKU Co., Ltd.

Curing Agent*7: a solution of 5 mass % Curezol® 2PZ (trade name, manufactured by Shikoku Chemicals Corporation) in methyl ethyl ketone.

Curing Agent*8: a dispersion of 5 mass % Curezol® 2P4MHZ-PW (trade name, manufactured by Shikoku Chemicals Corporation) in methyl ethyl ketone.

Polyethylene*9: low density polyethylene, weight average molecular weight (Mw) 4000, number average molecular weight (Mn) 1700, manufactured by Sigma-Aldrich Co.

While the illustrative embodiments of the present invention are provided in the above description, such is for illustrative purpose only and it is not to be construed as limiting the scope of the present invention. Modifications and variations of the present invention that will be obvious to those skilled in the art are to be covered by the following claims.

What is claimed is:

1. An imaging device module comprising:
   an imaging device including a light incident plane on which light is incident, and a reverse face disposed on an opposite side of the light incident plane, and
   a thermal conductive sheet provided on the reverse face for dissipating heat generated from the imaging device,
   wherein the thermal conductive sheet contains a boron nitride particle, the boron nitride particle being formed into a plate,
   the thermal conductive sheet has a thermal conductivity in a direction perpendicular to the thickness direction of 4 W/m·K or more, and
   an orientation angle $\alpha$ of the boron nitride particle relative to the thermal conductive sheet, which is calculated as an average of the angle formed between a longitudinal direction of the boron nitride particle and the perpendicular direction, is 25 degrees or less.

2. The imaging device module according to claim 1, wherein the imaging device is a CMOS image sensor.

3. The imaging device module according to claim 1, wherein the imaging device is a back-illuminated CMOS image sensor.

* * * * *